(12) United States Patent
Preikszas

(10) Patent No.: US 9,093,246 B2
(45) Date of Patent: Jul. 28, 2015

(54) SACP METHOD AND PARTICLE OPTICAL SYSTEM FOR PERFORMING THE METHOD

(75) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 11 days.

(21) Appl. No.: 12/942,477

(22) Filed: Nov. 9, 2010

(65) Prior Publication Data

US 2011/0108736 A1 May 12, 2011

(30) Foreign Application Priority Data

Nov. 9, 2009 (DE) .......................... 10 2009 052 392

(51) Int. Cl.
*G01K 1/08* (2006.01)
*H01J 37/147* (2006.01)
*H01J 37/295* (2006.01)

(52) U.S. Cl.
CPC .......... *H01J 37/1478* (2013.01); *H01J 37/2955* (2013.01); *H01J 2237/1506* (2013.01); *H01J 2237/1534* (2013.01)

(58) Field of Classification Search
CPC ........... H01J 37/00; H01J 37/02; H01J 37/04; H01J 37/14; H01J 37/141
USPC ............. 250/396 R, 397, 400, 306, 307, 311, 250/492.1, 492.22
See application file for complete search history.

(56) References Cited

U.S. PATENT DOCUMENTS

| | | | |
|---|---|---|---|
| 3,597,609 A * | 8/1971 | Anger et al. .................... 850/24 |
| 3,702,398 A | 11/1972 | Van-Essen et al. | |
| 3,801,784 A | 4/1974 | Wittry | |
| 3,914,608 A | 10/1975 | Malmberg | |
| 4,348,576 A * | 9/1982 | Anderl et al. ............... 219/121.3 |
| 4,663,525 A * | 5/1987 | Ohtsuki et al. ................ 250/307 |
| 4,962,313 A * | 10/1990 | Rose ............................. 250/311 |

(Continued)

FOREIGN PATENT DOCUMENTS

| | | |
|---|---|---|
| DE | 21 02 616 | 7/1971 |
| DE | 37 03 028 | 9/1988 |

(Continued)

OTHER PUBLICATIONS

Cassidy, The Trochoidal Monochromater, Washington State University.*

(Continued)

*Primary Examiner* — Nicole Ippolito
*Assistant Examiner* — Jason McCormack
(74) *Attorney, Agent, or Firm* — Fish & Richardson P.C.

(57) ABSTRACT

An SACP method includes directing a beam of charged particles onto an object surface of an object using a particle optical system, and detecting intensities of particles emanating from the object. The method further includes: (a1) adjusting an excitation of the second beam deflector for adjusting an impingement location of the beam on the object surface; (a2) adjusting an excitation of the first beam deflector for adjusting an angle of incidence of the beam on the object surface without changing the impingement location and detecting the intensity; and (a3) repeating the adjusting of the excitation of the first beam deflector for adjusting the angle of incidence without changing the impingement location such that a corresponding intensity is detected for each of at least 100 different angles of incidence at the same impingement location.

38 Claims, 2 Drawing Sheets

(56) References Cited

U.S. PATENT DOCUMENTS

| | | | |
|---|---|---|---|
| 4,990,779 A * | 2/1991 | Yoshitomi et al. | 250/310 |
| 5,013,914 A | 5/1991 | Otaka | |
| 5,254,857 A | 10/1993 | Ross et al. | |
| 5,319,207 A | 6/1994 | Rose et al. | |
| 5,483,077 A * | 1/1996 | Glavish | 250/492.2 |
| 6,388,261 B1 * | 5/2002 | Nakasuji | 250/398 |
| 6,614,026 B1 | 9/2003 | Adamec | |
| 6,646,267 B1 * | 11/2003 | Haider et al. | 250/396 R |
| 6,717,144 B2 | 4/2004 | Kimura et al. | |
| 6,855,939 B2 | 2/2005 | Rose et al. | |
| 6,963,067 B2 * | 11/2005 | Takeuchi et al. | 850/9 |
| 7,223,983 B2 | 5/2007 | Kawasaki et al. | |
| 7,723,706 B2 * | 5/2010 | Gammel et al. | 250/492.21 |
| 8,035,082 B2 * | 10/2011 | Yamazaki et al. | 250/310 |
| 2002/0036264 A1 * | 3/2002 | Nakasuji et al. | 250/306 |
| 2003/0010926 A1 * | 1/2003 | Lanio | 250/396 R |
| 2003/0111613 A1 | 6/2003 | Rose | |
| 2003/0122076 A1 * | 7/2003 | Matsuya et al. | 250/311 |
| 2003/0175600 A1 * | 9/2003 | Jeong et al. | 430/5 |
| 2003/0205678 A1 * | 11/2003 | Notte, IV | 250/423 F |
| 2004/0119021 A1 * | 6/2004 | Parker et al. | 250/396 R |
| 2004/0188635 A1 | 9/2004 | Kawasaki et al. | |
| 2005/0230622 A1 * | 10/2005 | Ushiki et al. | 250/311 |
| 2006/0033037 A1 * | 2/2006 | Kawasaki et al. | 250/398 |
| 2007/0164228 A1 * | 7/2007 | Frosien | 250/396 ML |
| 2007/0221860 A1 * | 9/2007 | Kawasaki et al. | 250/398 |
| 2008/0054186 A1 * | 3/2008 | Hosokawa | 250/396 R |
| 2008/0197280 A1 * | 8/2008 | Tanaka et al. | 250/306 |
| 2009/0200497 A1 * | 8/2009 | Adamec et al. | 250/503.1 |

FOREIGN PATENT DOCUMENTS

| | | |
|---|---|---|
| DE | 198 60 224 | 10/1999 |
| EP | 0 451 370 | 10/1991 |
| JP | S 58-174857 A | 11/1983 |
| JP | S 62-51142 A | 3/1987 |
| JP | S 62-52838 A | 3/1987 |
| JP | 2001-015055 | 1/2001 |
| JP | 2003168383 | 6/2003 |
| JP | 2006-054074 A | 2/2006 |
| JP | 2007-242490 A | 9/2007 |
| JP | 2008-078058 A | 4/2008 |

OTHER PUBLICATIONS

L. Reimer, "Scanning Electron Microscopy", Chapter 9.2, Springer-Verlag, 1998, pp. 359-378.

German Office Action for corresponding DE Appl No. 10 2009 052 392.8-54, dated Jun. 29, 2010.

German Office Action, with English translation, for corresponding DE Appl No. 10 2009 052 392.8-54, dated Jul. 12, 2011.

Joy et al., "Electron channeling patterns in the scanning electron microscope," J. App. Phys., 53(8):81-122, 1982.

Sawada et al., "Experimental evaluation of a spherical aberration-corrected TEM and STEM," J. Electr. Micro., 54(2):119-121, 2005.

Preikszas, "Charged Particle Beam Column and Method of Operating Same," U.S. Appl. No. 12/492,783, filed Jun. 26, 2009.

D.C. Joy et al., "Simultaneous display of micrograph and selected-area channelling pattern using the scanning electron microscope", Journal of Physics E: Scientific Instruments, vol. 4, No. 11, 1971, pp. 837-842.

Partial European search report from parallel European patent application No. 10 014 424.5, dated Aug. 11, 2014.

Japanese Office Action, with English translation, for parallel JP Appl No. 2010-250911, dated Jul. 15, 2014.

Extended European search report from parallel EP Appl No. 10014424.5, dated Dec. 10, 2014.

\* cited by examiner

SACP METHOD AND PARTICLE OPTICAL SYSTEM FOR PERFORMING THE METHOD

CROSS-REFERENCES TO RELATED APPLICATION

This application claims priority under 35 U.S.C. §119 to German Patent Application Serial No. 10 2009 052 392.8, filed Nov. 9, 2009, and entitled "SACP-VERFAHREN UND TEILCHENOPTISCHES SYSTEM ZUR AUSFÜHRUNG EINES SOLCHEN VERFAHRENS", the contents of which is hereby incorporated by reference in its entirety.

FIELD

The disclosure relates to a SACP method and a particle optical apparatus for performing the SACP method. SACP is an abbreviation for "selected area channeling pattern". This method relies on the so-called channeling effect to produce representations of a selected region of an object which is under inspection by using a beam of charged particles.

BACKGROUND

In a conventional SACP method, the object is typically positioned at various angles of orientation in the object region of an electron beam apparatus or ion beam apparatus. Depending on the angle of orientation, intensities of back-scattered secondary particles of the electron beam or ion beam, respectively, are measured. An analysis of the orientation angle dependence of the detected intensities can be used to draw conclusions about the symmetry, the orientation, internal stress states and other properties of the crystals which are located on the surface of the object.

SUMMARY

The penetration depth of a collimated beam of charged particles which penetrates into a crystal depends on an angle of incidence of the beam. For example, if the incident beam of charged particles is oriented along a lattice plane of the crystal, the penetration depth is greater as compared to when the incident beam and the lattice plane are non-parallel. A charged particle beam which penetrates deeper into the crystal generates less secondary particles which are released from the crystal.

The disclosure provides an SACP method and a particle optical system for performing the method.

According to embodiments, there is provided an SACP method that includes:
directing a beam of charged particles onto an object surface of an object using a particle optical system; and
detecting intensities of particles emanating from the object;
wherein the particle optical system includes: an objective lens for focusing the beam, a first beam deflector located upstream of the objective lens in a beam path of the beam, an aberration corrector located between the first beam deflector and the objective lens in the beam path and a second beam deflector located downstream of the aberration corrector in the beam path; and
wherein the method further includes:
(a1) adjusting an excitation of the second beam deflector for adjusting an impingement location of the beam on the object surface;
(a2) adjusting an excitation of the first beam deflector for adjusting an angle of incidence of the beam on the object surface without changing the impingement location and detecting the intensity; and
(a3) repeating (a2) such that a corresponding intensity is detected for each of at least 100 different angles of incidence at the same impingement location.

In other words, according to embodiments, the method includes repeating the adjusting of the excitation of the first beam deflector for adjusting the angle of incidence without changing the impingement location such that a corresponding intensity is detected for each of at least 100 different angles of incidence at the same impingement location.

In each repetition cycle, the excitation of the first beam deflector is adjusted to an angle of incidence, which corresponds to one of the at least 100 different angles of incidence. Thereby, the detected intensities correspond to each of the at least 100 different angles of incidence at the adjusted impingement location.

Accordingly, for the adjusted impingement location, at least 100 different angles of incidence are measured. For each of the at least 100 different angles of incidence, a corresponding intensity is detected. The angle of incidence is adjusted without changing the impingement location. In other words, the impingement location is kept constant, i.e. the detected intensities, which correspond to the at least 100 different angles of incidence, refer to the adjusted impingement location.

According to embodiments, an SACP method includes directing a beam of charged particles of a beam source onto a surface of an object using a particle optical system, wherein an impingement location and an angle of incidence of the beam of charged particles are independently adjustable. Here, the particle optical system includes an aberration corrector which is configured to compensate for aberrations which occur when the beam of charged particles is focused onto the object and which are generated by an objective lens and further components of the particle optical system. Thereby, the beam is finely focusable onto the object even at comparatively large angles of incidence relative to an optical axis of the particle optical system. The first beam deflector may be located between the beam source and the aberration corrector in the beam path. The second beam deflector may be located between the aberration corrector and the object in the beam path. In particular, the second beam deflector may be located between the aberration corrector and the objective lens in the beam path.

As used herein, the expression "located in the beam path" may include located along or relative to the beam path such that properties of the beam are adjusted. For example, the first and second beam deflector and/or the aberration corrector may be configured to generate electric and/or magnetic fields, which extend into the beam path.

According to an embodiment of the method, an excitation of the second beam deflector is adjusted such that the beam is incident at a selected impingement location on the object. Furthermore, an excitation of the first beam deflector is adjusted such that the beam is incident at a selected angle of incidence on the object. The excitation of the first beam deflector may be performed by keeping the impingement location constant, i.e. without changing the impingement location. Then, the excitation of the first beam deflector is repeatedly adjusted for adjusting the angle of incidence of the beam on the surface of the object without changing the impingement location. Thereby, at least one intensity of particles which emanate from the object is measured for each of a plurality of angles of incidence. The measured intensities thereby relate to the selected impingement location, which was kept constant.

The adjusting of the angle of incidence without changing the impingement location is repeated at least 100 times, in particular at least 1,000 times such that intensities are detected corresponding to at least 100 different angles of incidence, in particular to at least 1,000 different angles of incidence. The intensities, which are thereby detected represent a channeling pattern for a portion of the object, which is defined by the adjusted impingement location of the beam on the object. In particular, the intensities represent a "selected area channeling pattern" (SACP).

The adjustment of the angle of incidence is performed by the first beam deflector, which is located upstream of the aberration corrector in the beam path. The aberration corrector may be configured to correct aberrations. Such aberrations may occur when the beam passes the objective lens at a distance from the optical axis. Furthermore, such aberrations may be caused by the objective lens and/or other components of the particle optical system.

Accordingly, also at larger angles of incidence, the focusing of the beam on the surface of the object, i.e. in particular at the adjusted impingement location, is hardly affected.

According to a further embodiment, (a2) is repeated at a rate of more than 1,000 1/second, such as at a rate of more than 10,000 1/second. In other words, according to the embodiment, the adjusting of the excitation of the first beam deflector for adjusting the angle of incidence without changing the impingement location is performed at a rate of more than 1,000 1/second, such as at a rate of more than 10,000 1/second.

By electrically controlling the first beam deflector, it is possible to rapidly vary the angle of incidence of the beam on the object. According to exemplary embodiments, the first beam deflector and a first controller for exciting the first beam deflector are configured such that the adjustment of the excitation of the first beam deflector for adjusting the angle of incidence and also the associated detection of the corresponding intensity are repeatable at a rate of more than 1,000 1/second (e.g., more than 1,000 per second), such as more than 10,000 1/second (e.g., more than 10,000 per second).

According to further embodiments, the detecting of the intensities corresponding to the different angles of incidence at the constant (i.e. not changed) impingement location is repeated for different impingement locations. For example, the detecting of the intensities may be repeated for more than 10 different impingement locations or more than 100 different impingement locations.

According to a further embodiment, the method further includes (a4) repeating of (a1), (a2) and (a3) such that for each of at least 10 different impingement locations, at least 100 different angles of incidence are measured, and for each of the at least 100 different measured angles of incidence, a corresponding intensity is detected.

In other words, according to the embodiment, the method further includes (a4) repeating for at least 10 different impingement locations, where adjusting of the excitation of the second beam deflector for adjusting the impingement location, adjusting of the excitation of the first beam deflector for adjusting the angle of incidence without changing the impingement location, and repeating of the adjusting of the excitation of the first beam deflector without changing the impingement location is performed such that a corresponding intensity is detected for each of at least 100 different angles of incidence.

Thereby, in each repetition cycle for the at least 10 different impingement locations, the impingement location is adjusted to one of the at least 10 different impingement locations.

According to further embodiments, the method further includes:
(b1) adjusting the excitation of the first beam deflector for adjusting a second angle of incidence of the beam on the object surface;
(b2) adjusting the excitation of the second beam deflector for adjusting a second impingement location of the beam on the object surface without changing the second angle of incidence and detecting the intensity; and
(b3) repeating of (b2) such that a corresponding intensity is detected for each of at least 100 different impingement locations at the same second angle of incidence.

The second impingement location may be different from or equal to the impingement location of (a1). Also, the second angle of incidence may be different from or equal to the angle of incidence of (a2).

In other words, according to the embodiment, the method includes repeating the adjusting of the excitation of the second beam deflector for adjusting the second impingement location without changing the second angle of incidence such that a corresponding intensity is detected for each of at least 100 different impingement locations at the same second angle of incidence.

According to a further embodiment, prior to the detecting of the intensities corresponding to the different angles of incidence for the constant location of impingement, the impingement location is determined as follows: an excitation of the first beam deflector is adjusted for adjusting a predetermined or preselected angle of incidence of the beam on the surface of the object. Then, an excitation of the second beam deflector is repeatedly changed for changing an impingement location of the beam on the surface of the object without changing the preselected angle of incidence, wherein again an intensity of particles which emanate from the object is detected. The number of repetitions for repeatedly changing the impingement location may be more than 100 or more than 1,000. Thereby, intensities may be detected, which correspond to more than 100 and more than 1,000, respectively, different locations on the surface of the object. These intensities may be displayed in dependence on the different locations on the surface. The thereby obtained pattern corresponds to a conventional electron microscopic image of a portion of the object surface. The intensities or the image which correspond to the different impingement locations are analyzed for determining regions of interest on the object surface, which are to be inspected in a subsequent SACP analysis. To this end, target impingement locations of the beam on the object surface, which correspond to the regions of interest are determined. On these target impingement locations, the SACP analysis, which is described above, is performed.

According to a further embodiment, the SACP method further includes displaying intensities detected in (b3) in dependence on the at least 100 different impingement locations.

In other words, the detected intensities, which correspond to the at least 100 different impingement locations, are displayed in dependence on the at least 100 different impingement locations.

According to a further embodiment, the SACP method further includes: analyzing the dependence of the intensities detected in (b3) on the at least 100 different impingement locations; and determining a target impingement location based on the analyzing of the detected intensities.

In other words, the dependence of the detected intensities corresponding to the at least 100 different impingement locations are analyzed.

According to a further embodiment, in (a1), the excitation of the second beam deflector is performed such that the adjusted impingement location corresponds to the determined target impingement location.

In other words, according to the embodiment, in the adjusting of the excitation of the second beam deflector for adjusting the impingement location, the excitation of the second beam deflector is performed such that the adjusted impingement location corresponds to the determined target impingement location.

BRIEF DESCRIPTION OF THE DRAWINGS

The forgoing as well as other advantageous features will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
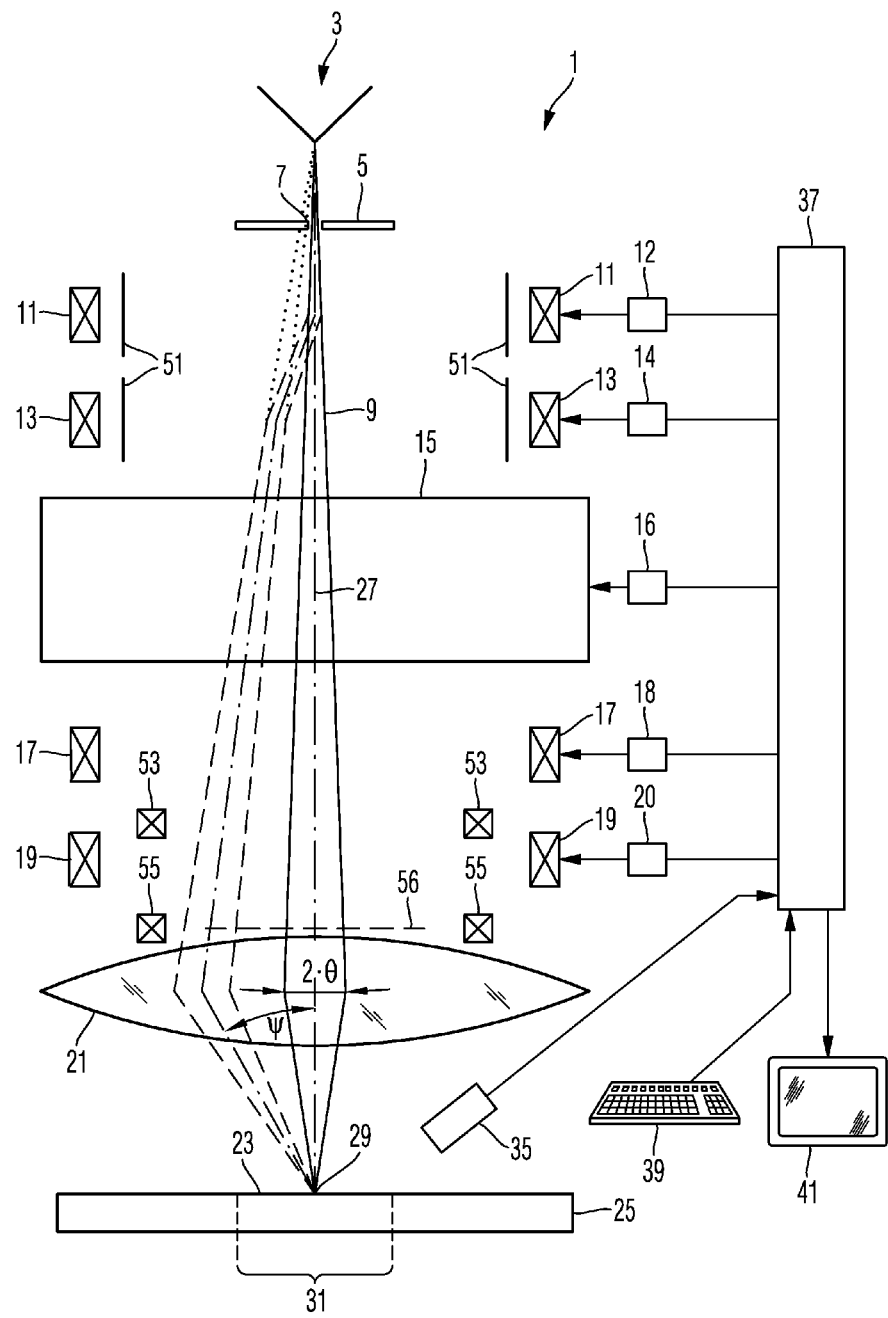
FIG. 1 shows a schematic illustration of an exemplary embodiment of a particle optical system.

In the exemplary embodiments described below, components that are alike in function and structure are designated as far as possible by alike reference numerals. Therefore, to understand the features of the individual components of a specific embodiment, the descriptions of other embodiments and of the summary should be referred to.

FIG. 1 shows a schematic illustration of a particle optical system 1 which is configured to perform an SACP method according to an exemplary embodiment. The particle optical system 1 includes a beam source 3, which emits charged particles, such as electrons or ions. The emitted charged particles pass a diaphragm 5, which includes an aperture 7 for passage of a particle beam 9 therethrough and for shaping the particle beam 9. After having passed the diaphragm 5, the particle beam 9 passes through two beam deflectors 11 and 13, which are located one behind the other in the beam path. Then, the particle beam 9 passes through an aberration corrector 15. Afterwards, the particle beam 9 passes through two beam deflectors 17 and 19, which are located one behind the other in the beam path. The particle beam 9 finally passes through an objective lens 21, which is configured to focus the beam 9 onto a surface 23 of an object 25 under inspection.

In FIG. 1, the beam 9 is illustrated as an undeflected beam, depicted by solid lines. In other words, a principal axis of the beam 9 corresponds to an optical axis 27 of the particle optical system 1. For example, the beam 9 is an electron beam having a beam current of 1 nA, wherein an opening angle 2 θ of the beam at the object surface amounts to for example 4 mrad.

Each of the beam deflectors 11, 13, 17 and 19 are configured to deflect the beam 9 from its respective beam path. To this end, the beam deflectors may be configured to provide suitable magnetic or electric fields, wherein each of the beam deflectors 11, 13, 17 and 19 includes an associated controller 12, 14, 18 and 20, which are configured to excite the respective beam deflector. Each of the beam deflectors is excited by providing an appropriate voltage or current for an adjustment of a certain beam deflection.

The aberration corrector 15 includes a plurality of electrostatic and/or magnetic multipole elements, each of which is excited by a controller 16 of the aberration corrector 15. In FIG. 1, the aberration corrector 15 is schematically illustrated as a box. The aberration corrector 15 may include components, such as for example those known from U.S. Pat. No. 7,223,983 B2 or from EP 0 451 370 A1. The multipole aberration correctors which are known from these documents include one or more quadrupole elements and, where appropriate, one or more octupole elements and possibly also one or more hexapole elements. The beam passes through these multipole elements along a substantially straight path. Other suitable aberration correctors include a mirror for reflecting the particle beam 9. Such aberration correctors are for example known from U.S. Pat. No. 5,319,207 B2 and from U.S. Pat. No. 6,855,939 B2. The disclosures of documents U.S. Pat. No. 7,223,983 B2, EP 0 451 370 A1, U.S. Pat. No. 5,319,207 B2 and U.S. Pat. No. 6,855,939 B2 are incorporated herein by reference in their entirety.

The aberration corrector 15 is configured to compensate for aberrations, which are caused by the objective lens 21 and also by further components of the particle optical system 1, which are located between the beam source 3 and the object 25.

In FIG. 1, the beam 9 is illustrated by dashed lines, such that the principal axis is tilted by an angle ψ relative to the optical axis 27 when the beam is incident at a location 29 on the surface of the object 23, wherein the location 29 is located on the optical axis 27. To this end, the beam deflector 11 is excited such that the beam deflector 11 deflects the beam 9 away from the optical axis, and the beam deflector 13 is excited such that the beam deflector 13 deflects the beam 9 slightly towards the optical axis. Extensions of rays of the beam 9 after having passed through the beam deflector 13 in a direction towards the beam source 3 are illustrated in FIG. 1 as a dotted lines. Thereby, it can be seen that the deflection of the beam 9 towards the optical axis which is caused by the beam deflector 13 is performed such that the apparent origin of the beam is still located on the optical axis 27. This is also the reason for the fact that as long as the beam deflectors 17 and 19 are not excited, the tilted beam, which is illustrated by dashed lines is still incident on the location 29, which is located on the optical axis 27 and on the surface of the object 23.

In the described example, the beam deflectors 11, 13 are controlled such that the apparent origin of the beam on the optical axis 27 is located at the location of the beam source 3. Thereby, the beam seems to be tilted about the location of the beam source 3. In further embodiments, it is possible to tilt the beam about a point, which is different from the location of the beam source 3. Such a point may be a location of a crossover of the beam and/or a location along the optical axis, which is optically conjugate to the object region or the object plane of the particle optical system.

Through commonly controlling the beam deflectors 11 and 13, it is thereby possible to change or adjust the angle of incidence ψ of the beam 9 on the object surface 27 without changing the impingement location 29 of the beam on the object. In doing this, the angle of incidence ψ may be changed continuously, for example within a range of between −100 mrad to +100 mrad, by exciting the beam deflectors 11 and 13.

Each of the beam deflectors 17 and 19 may be excited such that the beam 9 is deflected such that the location 29, at which the beam 9 is incident on the object surface 23 of the object 25, is displaced away from the optical axis 27 without changing the angle of incidence ψ, which is adjusted by exciting the beam deflectors 11 and 13. To this end, the deflectors 17 and 19 may be excited such that the beam is deflected by the deflector 17 away from the optical axis and the beam is further deflected by the deflector 19 towards the optical axis. Thereby, the beam is apparently tilted about a point located on the back focal plane 56 of the objective lens 21.

Hence, by suitably exciting the beam deflectors 17 and 19, it is possible to displace the impingement location 29 within a two-dimensional range 31 on the object surface without changing the angle of incidence ψ. The two-dimensional range 31 may have an extent being within the range of 1 μm to 100 μm. For example, a side length of the range 31 may be within the range 1 μm to 100 μm.

It is also conceivable, that the impingement location 29 is adjusted within the two-dimensional range 31 by suitably exciting the beam deflectors 11 and 13 in case aberrations which are caused by the off-axis passage of the beam 9 through the objective lens 21 are sufficiently compensated. This is in particular possible by using an aberration corrector, which includes a mirror, wherein the particle beam is reflected at the mirror.

The particle optical system 1 further includes a particle detector 35, which is configured to detect particles, which emanate from the object 25 and which are generated by the incident beam 9. The particles, which emanate from the object 25 may include for example electrons, such as back-scattered electrons and/or secondary electrons. The detector 35 transmits detection signals to a main controller 37, which is configured to process, store and analyze the received detection signals. The controller 37 also controls the controllers 12, 14, 16, 18 and 20 which are configured to excite the beam deflectors 11, 13, 17, 19 and the elements of the aberration corrector 15, respectively. The controller 37 is configured to receive control commands from an input device such as a keyboard 39 or a network interface. The controller is further configured to output measurement results for example on a display 41 or to the network interface.

By using the particle optical system 1, it is possible to let the particle beam 9 being incident at an adjustable angle of incidence ψ and at an adjustable impingement location 29 on the surface 23 of the object 25.

In particular, it is possible to systematically adjust the impingement location 29 within the range 31 at a constant adjusted angle of incidence ψ. Thereby, the range 31 is scanned by the particle beam 9 and the dependence of particle intensities on the impingement location 29 is detected by the detector 35. The particle intensities, which are detected in such a spatial scan may be graphically displayed and analyzed depending on the impingement location 29. The graphical representation of the particle intensity as a function depending on the impingement location 29 corresponds to a conventional electron microscopic image.

Furthermore, it is possible to systematically adjust the angle of incidence in two spatial directions at a constant impingement location 29 and to detect with the detector 35 intensities corresponding to the angle of incidence. The particle intensities which are detected by such an angular scan represent a "selected area channeling pattern" (SACP).

For an object, which includes crystals located at the object surface, the intensity of the particles which are detected with the detector 35 depends on the angle of incidence of the beam on the object surface. This is caused by the channeling effect. Background information related to the channeling effect is contained for example in chapter 9.2 of the book "Scanning Electron Microscopy" of L. Reimer, Springer-Verlag, 1998, pages 359 to 378.

An analysis of the intensities, which are detected by an angular scan may yield information about the type and orientation of crystal material, which is present at the impingement location 29 of the object 25, about internal stress states of the crystal material and about further properties of the object.

For performing an angular scan, the beam deflectors 11 and 13 and the controllers 12 and 14, respectively, are configured to change the angle of incidence by more than 50 mrad within a time period of less than 1/100 s, and in particular of less than 1/1,000 s. At such a scan velocity, it is for example possible to scan an angular range of ±55 mrad times ±50 mrad within 0.1 s and to thereby detect particle intensities which correspond for example to 256 times 256 image points or pixels.

During the angular scan and/or the spatial scan, an excitation of one or more or all elements of the aberration corrector 15 by the controller 16 may be kept constant or substantially constant.

In the following, further particle optical components will be described with reference to FIG. 1, wherein the particle optical components may be integrated into the particle optical system 1 for improving its quality:

One or both of the beam deflectors 11, 13 may be designed as a Wien filter for compensating a dynamically varying dispersion, which may occur during the angular scan. Here, a Wien filter is a particle optical component, which provides an electrostatic field which is superimposed on a magnetic field within a spatial region. The field directions of the electrostatic field and the magnetic field are oriented transversely to each other, in particular perpendicular to each other.

In the exemplary embodiment shown in FIG. 1, the beam deflectors 11, 13 are magnetic beam deflectors. Hence, an additional pair of electrodes 51 may transform the deflector 11 and the deflector 13, respectively to a Wien filter. The electrodes 51 may be excited by a controller which is not separately illustrated in FIG. 1 and which is also controlled by the main controller 37.

A quadrupole stigmator 53 may be provided between the aberration corrector 15 and the objective lens 21 in the beam path for compensating a dynamically varying astigmatism, which may occur during the angular scan caused by an imperfect adjustment of the aberration corrector 15. For example, the quadrupole stigmator 53 may be provided between the deflector 17 and the objective lens 21 in the beam path. The quadrupole stigmator 53 may be excited by a controller (not illustrated in FIG. 1), which is controlled by the main controller 37.

Furthermore, a focusing coil 54 may be provided within a range around the objective lens 21. The focusing coil may be located between the aberration corrector 15 and the objective lens 21 in the beam path. For example, the focusing coil may be provided between the objective lens 21 and the deflector 19 and/or between the objective lens 21 and the deflector 17 in the beam path. The focusing coil 54 may be formed by an air-core coil. The focusing coil 54 may be configured to compensate a dynamically varying defocus, which may occur during the angular scan caused by an imperfect adjustment of the aberration corrector 15. Also, the focusing coil 54 is excited by a controller (not illustrated in FIG. 1), which is controlled by the main controller 37.

Figure 2:
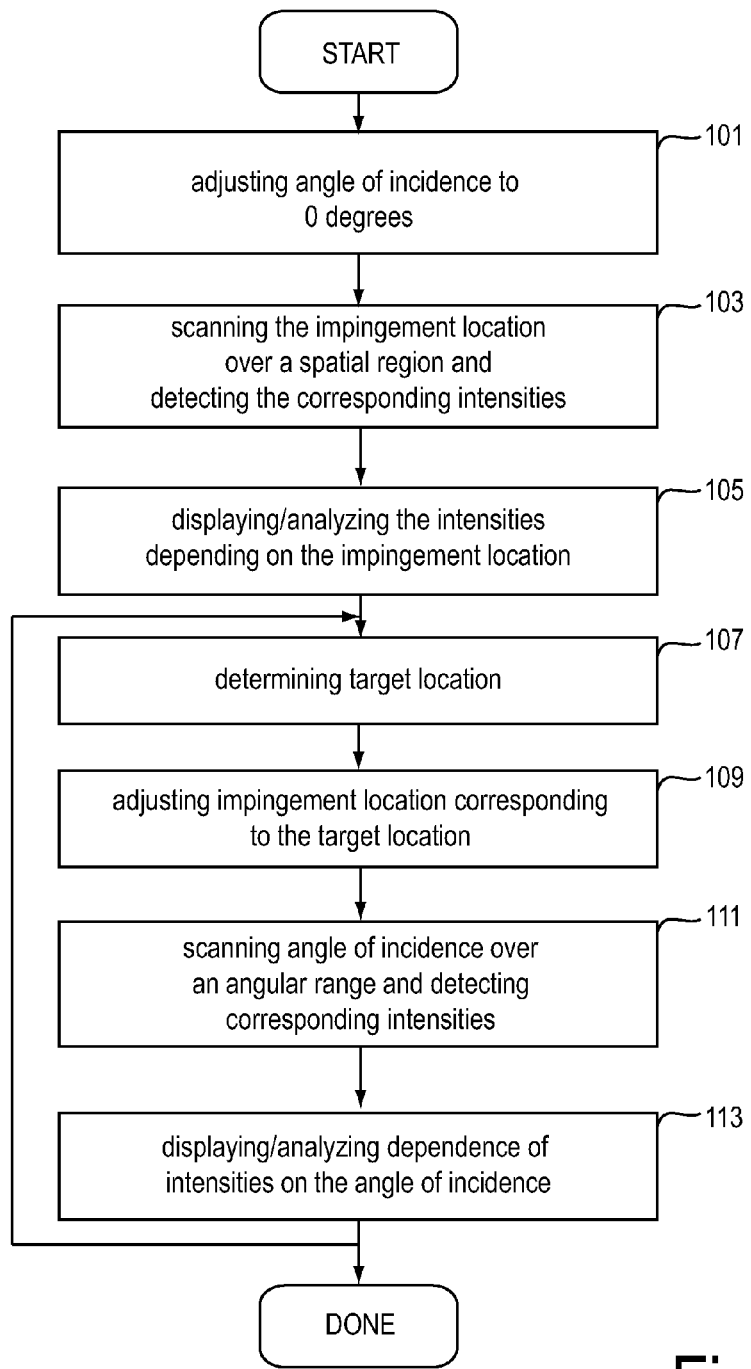
FIG. 2 shows a schematic flow diagram according to an exemplary embodiment of an SACP method.

In the following, an exemplary embodiment of an SACP method is described in summary with reference to the flow-chart of FIG. 2. After having started the method, an adjusting 101 of the angle of incidence ψ to a pre-selected value of for example 0 mrad with respect to the surface normal of the object surface is performed by controlling the controllers 12 and 14 of the respective beam deflectors 11 and 13. Then, a scanning 103 of an impingement location of the beam is performed without changing the angle of incidence ψ by controlling the controllers 18 and 20 of the beam deflectors 17 and 19, respectively, over a range 31 of the object surface 23. In other words, the angle of incidence is kept constant during the scan over impingement locations within the range 31. During this spatial scan, particle intensities, which are detected by the detector 35 are recorded. Then, the method proceeds with analyzing and/or displaying 105 of the particle intensities. By way of example, the intensities are displayed on a display 41. Then, a user may select regions of interest based on the displayed intensities. Additionally or alternatively, a region of interest may be selected based on an automatic analysis of the particle intensities which have been detected during the spatial scan.

From the regions of interest, a determining 107 of a target location for a subsequent SACP analysis is performed. Then, the beam deflectors 17 and 19 are excited such that the particle beam 9 impinges on the determined target location on the object surface. In other words, the method proceeds by adjusting 109 an impingement location, which corresponds to the target location, by adjusting the excitation of the beam deflectors 17 and 19.

Then, a scanning 111 of the angle of incidence $\psi$ is performed by systematically varying the angle of incidence $\psi$ within a two-dimensional angular range by controlling the beam deflectors 11 and 13. Particle intensities, which correspond to the different angles of incidence $\psi$ are detected. Then, the method proceeds by displaying or automatically analyzing 113 the dependence of the detected particle intensities on the angle of incidence $\psi$. From the dependence of the detected particle intensities on the angle of incidence $\psi$, it is possible to determine the type and orientation of the crystal, its internal stress states and/or other properties of the crystal at the target location.

Then, it is possible to repeat the determining 107 of the target location, the adjusting 109 of the impingement location which corresponds to the target location, the scanning 111 of the angle of incidence $\psi$ and the displaying/analyzing 113 of the dependence of the intensities on the angle of incidence $\psi$.

In doing this, it is also possible to optimize the angular range of the angular scan for either each of the regions of interest individually or for all regions of interest together. Also, only selected regions of interest may be optimized. This may be achieved by performing an SACP analysis on individual or selected regions of interest and by again optimizing, based on this SACP analysis, the angular range of the angular scan for generating an image having high contrast of crystal orientation.

Furthermore, it is possible, to perform an angular scan at a region of interest of the object and to determine from an analysis of this angular scan an optimal angle of incidence of the beam for at least this location of the object, wherein the optimal angle allows a high channeling contrast. The determined optimal angle is selected and kept constant (i.e. is not changed) during a subsequent spatial scan. In the thereby generated image, at least the region of interest, on which the determining of the optimal angle has been based, has a high channeling contrast, wherein other regions of the object are discernible by their intensities, which depend on the crystal orientation of the respective region.

Furthermore, it is possible to perform in the region 31 of the object surface 23 a spatial scan and to automatically analyze a thereby obtained electron microscopic image. Thereby, locations of structures of interest may be determined such as gate structures of an electronic device. The automatic analysis of the spatial scan may include image analysis routines. At the thereby identified locations of the structures of interest, an SACP analysis may be performed. Thereby, for example, mechanical stress may be determined at the structures of interest.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A method, comprising:
   directing a beam of charged particles onto an object surface of an object using a particle optical system, the particle optical system comprising: an objective lens configured to focus the beam of charged particles onto the object surface; a first beam deflector located upstream of the objective lens along a beam path of the beam of charged particles; an aberration corrector located between the first beam deflector and the objective lens along the beam path; and a second beam deflector located downstream of the aberration corrector along the beam path;
   detecting intensities of particles emanating from the object;
   (a1) adjusting an excitation of the second beam deflector to adjust an impingement location of the beam on the object surface;
   (a2) adjusting an excitation of the first beam deflector to adjust an angle of incidence of the beam on the object surface without changing the impingement location and detecting the intensity;
   (a3) repeating (a2) so that a corresponding intensity is detected for each of at least 100 different angles of incidence at the same impingement location; and
   using excitation signals to excite a Wien filter, the excitation signals having a period of less than 1/100 second, wherein the Wien filter is upstream of the aberration corrector in the beam path of the beam of the charged particles.

2. The method of claim 1, wherein (a2) is performed at a rate of more than 1,000 1/second.

3. The method of claim 1, further comprising displaying the detected intensities corresponding to the at least 100 different angles of incidence based on the at least 100 different angles of incidence.

4. The method of claim 1, further comprising repeating (a1) through (a3) for each of at least 10 different impingement locations.

5. The method of claim 1, further comprising:
   (b1) adjusting the excitation of the first beam deflector to adjust a second angle of incidence of the beam on the object surface;
   (b2) adjusting the excitation of the second beam deflector to adjust a second impingement location of the beam on the object surface without changing the second angle of incidence and detecting the intensity; and
   (b3) repeating (b2) so that a corresponding intensity is detected for each of at least 100 different impingement locations at the same second angle of incidence.

6. The method of claim 5, further comprising displaying the detected intensities, corresponding to the at least 100 different impingement locations based on the at least 100 different impingement locations.

7. The method of claim 5, further comprising:
analyzing a dependence of the detected intensities corresponding to the at least 100 different impingement locations based on the at least 100 different impingement locations; and
determining a target impingement location based on the analyzing of the dependence.

8. The method of claim 7, wherein, when adjusting the excitation of the second beam deflector to adjust the impingement location, the excitation of the second beam deflector is performed so that the adjusted impingement location corresponds to the determined target impingement location.

9. The method of claim 1, further comprising using a quadrupole stigmator to compensate a dynamically varying astigmatism of the beam path of the beam of charged particles, wherein the quadrupole stigmator is between the aberration corrector and the objective lens along the beam path.

10. The method of claim 9, further comprising using a focusing coil to compensate a dynamically varying defocus of the beam path of the beam of charged particles, wherein the focusing coil is between the aberration corrector and the objective lens along the beam path.

11. The method of claim 1, further comprising using a focusing coil to compensate a dynamically varying defocus of the beam path of the beam of charged particles, wherein the focusing coil is between the aberration corrector and the objective lens along the beam path.

12. The method of claim 1, wherein (a3) comprises exciting the first beam deflector by transmitting excitation signals having a period of less than $1/100$ second to the first beam deflector.

13. The method of claim 12, wherein the aberration corrector corrects spherical and chromatic aberrations.

14. The method of claim 1, wherein the aberration corrector corrects spherical and chromatic aberrations.

15. The method of claim 1, wherein an excitation of one or more elements of the aberration corrector is kept substantially constant.

16. The method of claim 1, further comprising, while repeating (a2), controlling a dynamically varying dispersion of the beam of charged particles which is caused by repeating (a2).

17. The method of claim 16, further comprising using a quadrupole stigmator to compensate a dynamically varying astigmatism of the beam path of the beam of charged particles, wherein the quadrupole stigmator is between the aberration corrector and the objective lens along the beam path.

18. The method of claim 17, further comprising using a focusing coil to compensate a dynamically varying defocus of the beam path of the beam of charged particles, wherein the focusing coil is between the aberration corrector and the objective lens along the beam path.

19. The method of claim 16, further comprising using a focusing coil to compensate a dynamically varying defocus of the beam path of the beam of charged particles, wherein the focusing coil is between the aberration corrector and the objective lens along the beam path.

20. The method of claim 16, wherein the dynamically varying dispersion is compensated by using the first beam deflector.

21. The method of claim 16, wherein, at least during (a3), excitation of one or more elements of the aberration corrector is kept substantially constant.

22. A method, comprising:
directing a beam of charged particles onto an object surface of an object using a particle optical system, the particle optical system comprising: an objective lens configured to focus the beam of charged particles onto the object surface; a Wien filter which comprises a first beam deflector located upstream of the objective lens along a beam path of the beam of charged particles; an aberration corrector located between the first beam deflector and the objective lens along the beam path; and a second beam deflector located downstream of the aberration corrector along the beam path;
detecting intensities of particles emanating from the object;
(a1) adjusting an excitation of the second beam deflector to adjust an impingement location of the beam on the object surface;
(a2) adjusting an excitation of the first beam deflector to adjust an angle of incidence of the beam on the object surface without changing the impingement location and detecting the intensity;
(a3) using excitation signals having a period of less than $1/100$ second to excite the Wien filter; and
(a4) repeating (a2) and (a3) so that a corresponding intensity is detected for each of at least 100 different angles of incidence at the same impingement location.

23. The method of claim 22, wherein (a2) comprises exciting the first beam deflector by transmitting excitation signals having a period of less than $1/100$ second to the first beam deflector.

24. The method of claim 23, wherein the aberration corrector corrects spherical and chromatic aberrations.

25. The method of claim 22, wherein the aberration corrector corrects spherical and chromatic aberrations.

26. The method of claim 22, further comprising:
(b1) adjusting the excitation of the first beam deflector to adjust a second angle of incidence of the beam on the object surface;
(b2) adjusting the excitation of the second beam deflector to adjust a second impingement location of the beam on the object surface without changing the second angle of incidence and detecting the intensity; and
(b3) repeating (b2) so that a corresponding intensity is detected for each of at least 100 different impingement locations at the same second angle of incidence.

27. The method of claim 22, wherein (a2) comprises excite the first beam deflector with excitation signals having a period of less than $1/100$ second.

28. The method of claim 22, further comprising, while repeating (a2), controlling a dynamically varying dispersion of the beam of charged particles which is caused by repeating (a2) and (a3).

29. The method of claim 5, wherein the dynamically varying dispersion is compensated by using the first beam deflector.

30. The method of claim 29, wherein, at least during (a4), excitation of one or more elements of the aberration corrector is kept substantially constant.

31. A system, comprising:
a beam source configured to generate a beam of charged particles;
a Wien filter comprising a first beam deflector downstream of the beam source along a beam path of the beam of the charged particles;
an objective lens configured to focus the beam onto an object, the objective lens being downstream of the first beam deflector along the beam path of the beam of the charged particles;
an aberration corrector between the first beam deflector and the objective lens along the beam path of the beam of the charged particles;

a second beam deflector downstream of the first beam deflector along the beam path of the beam of the charged particles;

a first controller configured to excite the first beam deflector and to transmit first excitation signals to the first beam deflector; and a second controller configured to transmit second excitation signals to the Wien filter, each of the second excitation signals having a period of less than 1/100 second, wherein each of the first excitation signals have a period of less than 1/100 second, and wherein:
the second beam deflector is configured to adjust an impingement location of the beam on a surface of the object; and
the first controller is configured to repeatedly adjust an excitation of the first beam deflector to adjust an angle of incidence of the beam on the surface of the object without changing the impingement location of the beam for at least 100 different angles of incidence of the beam on the surface of the object.

32. The system of claim 31, wherein the aberration corrector is configured to correct spherical and chromatic aberrations.

33. The system of claim 31, further comprising a quadrupole stigmator configured to compensate a dynamically varying astigmatism of the beam path of the beam of charged particles, wherein the quadrupole stigmator is between the aberration corrector and the objective lens along the beam path.

34. The system of claim 33, further comprising a focusing coil configured to compensate a dynamically varying defocus of the beam path of the beam of charged particles, wherein the focusing coil is between the aberration corrector and the objective lens along the beam path.

35. The system of claim 31, further comprising a focusing coil configured to compensate a dynamically varying defocus of the beam path of the beam of charged particles, wherein the focusing coil is between the aberration corrector and the objective lens along the beam path.

36. The system of claim 31, wherein the system is configured so that, during use of the system, the dynamically varying dispersion is compensated by using the first beam deflector.

37. The system of claim 31, wherein the first controller and the first beam deflector are configured to vary an angle of incidence of the beam on the object by more than 50 mrad within the period of the first excitation signal, and the dynamically varying dispersion is at least partially caused by the variation of the angle of incidence.

38. The system of claim 37, further comprising a third controller configured so that, at least during the variation of the angle of incidence, the third controller keeps an excitation of one or more elements of the aberration corrector substantially constant.

* * * * *

UNITED STATES PATENT AND TRADEMARK OFFICE
CERTIFICATE OF CORRECTION

PATENT NO. : 9,093,246 B2
APPLICATION NO. : 12/942477
DATED : July 28, 2015
INVENTOR(S) : Dirk Preikszas Page 1 of 1

It is certified that error appears in the above-identified patent and that said Letters Patent is hereby corrected as shown below:

Title Page, Col. 2, line 1 under "OTHER PUBLICATIONS", delete "Monochromater," and insert
-- Monochromator, --.

Signed and Sealed this
Twenty-first Day of June, 2016

Michelle K. Lee
*Director of the United States Patent and Trademark Office*